United States Patent [19]
Kim et al.

[11] Patent Number: 5,381,376
[45] Date of Patent: Jan. 10, 1995

[54] VIDEO RAM HAVING BLOCK SELECTION FUNCTION DURING SERIAL WRITE TRANSFER OPERATION

[75] Inventors: Min-Tae Kim, Suwon; Dong-Jae Lee; Seung-Mo Seo, both of Seoul, all of Rep. of Korea

[73] Assignee: SamSung Electronics Co., Ltd., Suwon, Rep. of Korea

[21] Appl. No.: 976,920

[22] Filed: Nov. 19, 1992

[30] Foreign Application Priority Data

Nov. 22, 1991 [KR] Rep. of Korea ............... 20913/1991

[51] Int. Cl.$^6$ ............................................. G11C 7/00
[52] U.S. Cl. ............................ 365/230.03; 365/221; 365/230.05
[58] Field of Search ............... 365/221, 189.05, 230.03, 365/230.04, 230.05, 230.09, 240

[56] References Cited

U.S. PATENT DOCUMENTS

| | | | |
|---|---|---|---|
| 4,636,986 | 1/1987 | Pinkham | 365/189.02 |
| 4,639,890 | 1/1987 | Heilveil et al. | 365/230.09 |
| 5,065,369 | 12/1991 | Toda | 365/230.05 |
| 5,121,360 | 6/1992 | West et al. | 365/230.03 |

*Primary Examiner*—Eugene R. LaRoche
*Assistant Examiner*—F. Niranjan
*Attorney, Agent, or Firm*—Robert E. Bushnell

[57] ABSTRACT

A video RAM having a random access memory, a serial access memory, and a block selector for high speed data processing is disclosed. A serial write transfer operation for transferring data stored in the serial access memory to the random access memory is performed by writing the serial write data on all serial access memory blocks and then transmitting the serial write data selectively to the desired blocks of the random access memory.

23 Claims, 13 Drawing Sheets

VIDEO RAM HAVING BLOCK SELECTION FUNCTION DURING SERIAL WRITE TRANSFER OPERATION

CROSS REFERENCE TO RELATED APPLICATIONS

This application makes reference to, and claims the benefits provided under 35 U.S.C. §119 arising from an application earlier filed in The Korea Industrial Property Office on Nov. 22, 1991 and assigned Serial No. 20913/1991, copy of which application is attached hereto and incorporated into this application.

SCOPE OF THE INVENTION

The instant invention relates to a dual port memory, and more specifically to a video random access memory having a serial access port in a semiconductor memory device and a process for addressing a video random access memory.

BACKGROUND OF THE INVENTION

Video random access memories (also known as dual port dynamic RAM's and video random access memories, or VRAM's) arc memory devices having both a port enabling random access to the memory device and a serial port for providing access for transferring data to and from the memory device. The two kinds of ports are necessary because, while memory access by a central processing unit (hereinafter CPU) is performed randomly, memory access in case of reading data to be displayed on a display device (e.g., cathode ray tube) is performed serially. The video random access memory or dual port dynamic RAM is used in applications were the memory device must perform both of these functions.

In order to increase the speed of the video random access memory, the time required for serial data transfer operations must be minimized. Serial data transfer operations of the video random access memory include both serial read transfer operations and serial write transfer operations. In the serial read transfer operation, data stored in the random access memory is transferred to a serial access memory (also referred to as a SAM); the data is then read out of the serial access memory through the serial access port. In the serial write transfer operation, data is first written into the serial access memory and thereafter transferred from the serial access memory to the random access memory.

The serial write transfer operation is of particular importance and especially the processing speed of the serial write transfer operation. Conventional serial write transfer operations are slow, restricting the overall speed at which data to be stored in the video RAM can be processed in, for instance, image processing. In applications using special integrated memory devices such as video RAM's, as well as in application using related devices such as field memories and graphics memories, the time for the serial write transfer operation should be minimized as much as possible by optimizing both design and operation of the devices.

SUMMARY OF THE INVENTION

It is an object of the present invention is to provide an improved video random access memory and process for transferring data to and from the memory.

It is another object to provide a random access memory and process exhibiting enhanced serial data transfer operations.

It is still another object to provide a video random access memory and a process for performing a high speed serial write transfer operation.

These and other objects may be achieved according to one aspect of the present invention, with a video random access memory having a random access memory, a first serial access memory, and a second serial access memory. The random access memory comprises a plurality of blocks. Each of the blocks of the random access memory is divided into a first sub-block and a second sub-block, with each of the sub-blocks having a plurality of memory cells in an m×n matrix.

The first and second serial access memories each includes a plurality of blocks for accessing different ones of the random access memory sub-blocks. The first serial access memory accesses the first sub-blocks of the random access memory while the second serial access memory accesses the second sub-blocks of the random access memory. Each block of the serial access memory has memory cells in a 1×n matrix connected with each column of the corresponding sub-block of the random access memory.

The video random access memory constructed according to the principles of the present invention includes a block selector for enabling selectively the blocks of the first or second serial access memory to receive data during serial write transfer operations. The video random access memory further includes a first and a second data transfer gate for selectively connecting blocks of the first and second serial access memories, respectively, to corresponding sub-blocks of the random access memory to allow data transmission to the random access memory.

The video random access memory according to the present invention transfers the serial write data to the selected sub-blocks of the random access memory by first writing the data to all the blocks of one of the first and second serial access memories in response to the control of the block selector and then selectively transfers the data from the selected serial access memory to the selected sub-blocks of the random access memory under the control of the respective data transfer gate.

When reading data from the random access memory to the serial access port, the video random access memory according to the present invention may use a serial read operation in which data in sub-blocks of the random access memory is selected by the block selector, and then the data of the selected blocks is transmitted to the serial access memory.

BRIEF DESCRIPTION OF THE DRAWINGS

For a better understanding of the invention and to show how the same may be realized, reference will now be made, by way of example, to the accompanying drawings, in which:

FIGS. 2A and 2B are block diagrams showing block selection And data transmission according to the present invention during a serial write transfer operation, while

DETAILED DESCRIPTION OF CERTAIN PREFERRED EMBODIMENTS

Figure 1A:
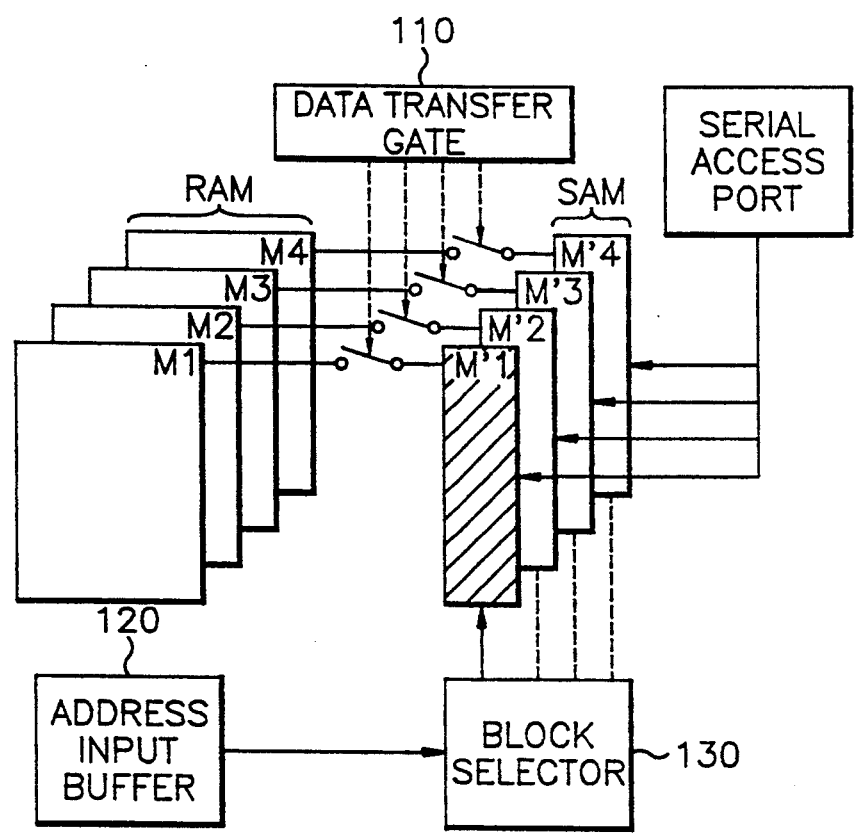
FIGS. 1A through 1D are block diagrams of a conventional write transfer operation for a video random access memory showing conventional block selection and data transmission during a serial write transfer operation.
Figure 1B:
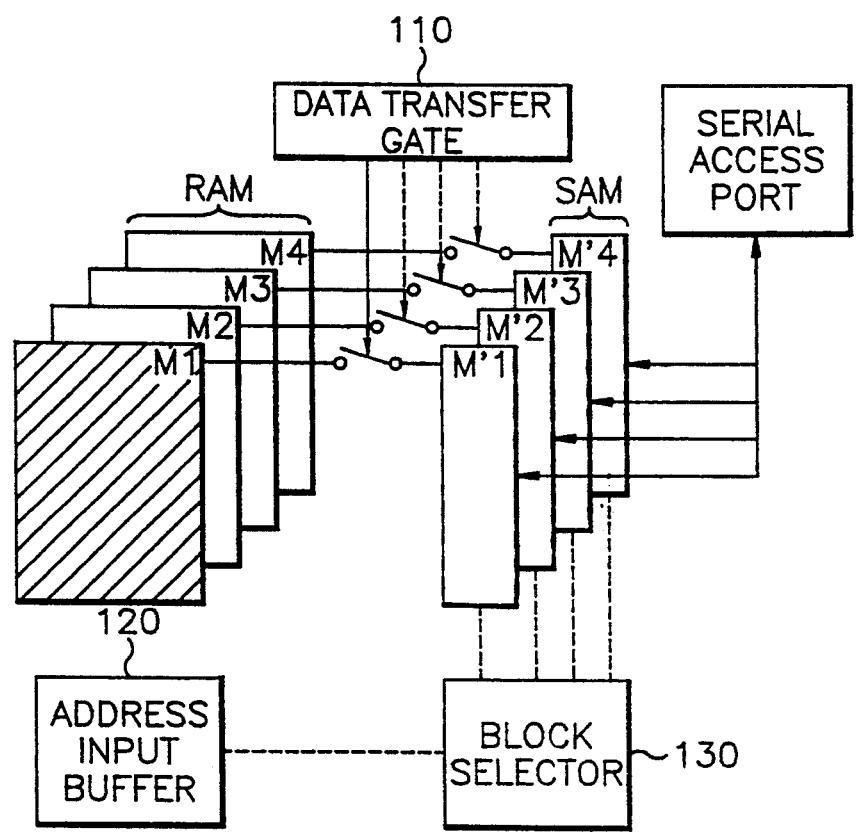

Turning now to the figures, FIGS. 1A and 1B show an example of a conventional data write transfer operation. An address input buffer 120 receives addresses for data to be stored into a video random access memory. The address input buffer 120 then provides the addresses to a block selector 130. Block selector 130 decodes the addresses and generates a block selection signal enabling one of the four blocks M'1, M'2, M'3, and M'4 of a serial access memory (sometimes referred to as a SAM) to receive the data, as indicated by the shaded block M'1 in FIG. 1A. The data is then transmitted from the selected block M'1 of the serial access memory to a selected block of the random access memory under the control of a data transfer gate 110, as is indicated by the shaded block M1 of Fig. 1B.

Figure 1C:
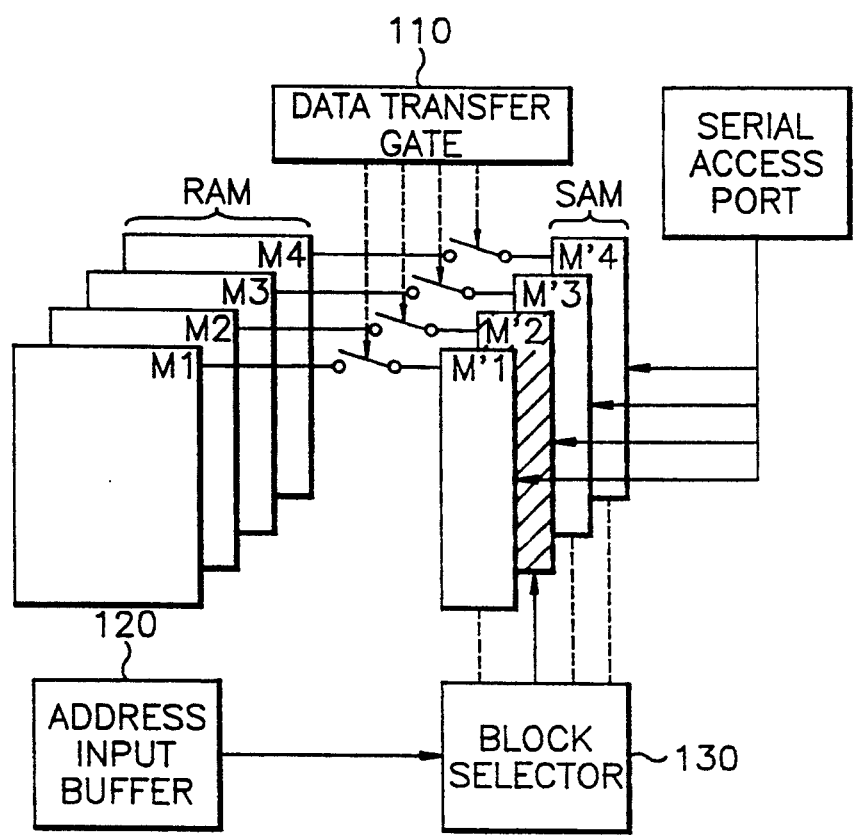
Figure 1D:
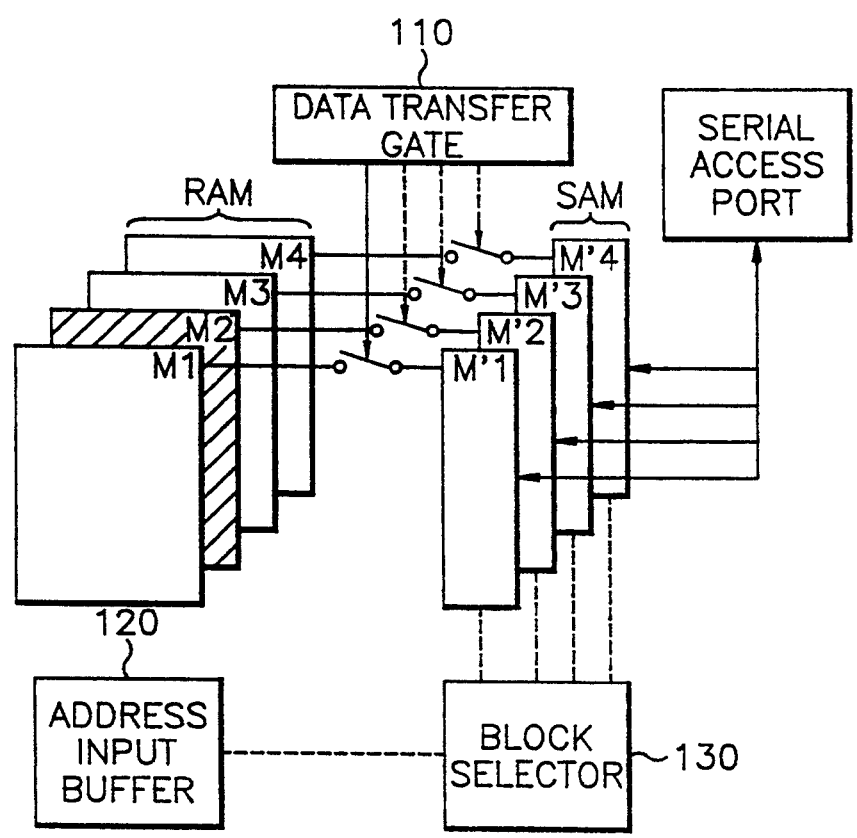

In a similar manner, the serial write transfer operation is performed continuously with respect to the next block of the random access memory as is shown in FIGS. 1C and 1D. Here, as is represented in FIG. 1C, for a serial write transfer operation of data to block M2 of the random access memory, block selector 130 generates a block selection signal enabling block M'2 of the serial access memory to receive data. Thereafter, as is represented in FIG. 1D, the data is transferred from M'2 to the block M2 of the RAM under the control of the data transfer gate 110 of FIG. 1D.

Turning now to FIGS. 2A, 2B, 2C, and 2D, a dual port memory device, video random access memory, constructed according to the principles of the instant invention is represented. The video random access memory comprises a random access memory RAM, a first serial access memory SAM1, and a second serial access memory SAM2. Random access memory RAM comprises an array formed by a plurality of blocks M1, M2, M3, and M4. Each of the blocks M1–M4 of random access memory RAM is divided into a first sub-block S-1 and a second sub-block S-2, and each of these sub-blocks have a plurality of memory cells organized in an $m \times n$ matrix.

The first serial access memory SAM1 and the second serial access memory SAM2 each comprises a plurality of blocks M'1, M'2, M'3, and M'4 each block having memory cells organized in an $1 \times n$ matrix. Blocks M'1, M'2, M'3, and M'4 of the first serial access memory SAM1 are able to exchange data with each column (n) of the first sub-blocks S-1 of blocks M1, M2, M3, M4 respectively of the random access memory RAM, via a first data transfer gate 210. Similarly, in the second serial access memory SAM2, blocks M'1, M'2, M'3, M'4 exchange data with the second sub-blocks S-2 of blocks M1, M2, M3, and M4, respectively, of the random access memory RAM, via a second data transfer gate 215.

The first and second serial access memories SAM1, SAM2 each receives data from a serial access port 205. The serial access memories SAM1, SAM2 are enabled to receive the data by block selection signals generated by a block selector 230. The block selection signals are generated by decoding received first address signals, RA8. The first address signals RA8 are buffered and applied to the block selector 230 by an input address buffer 220. Data transfer gates 210 and 215 selectively connect the blocks M'1–M'4 of serial; serial access memories SAM1, SAM2 to the sub-blocks of the random access memory RAM in dependence upon the first address signals RA8.

Figure 2A:
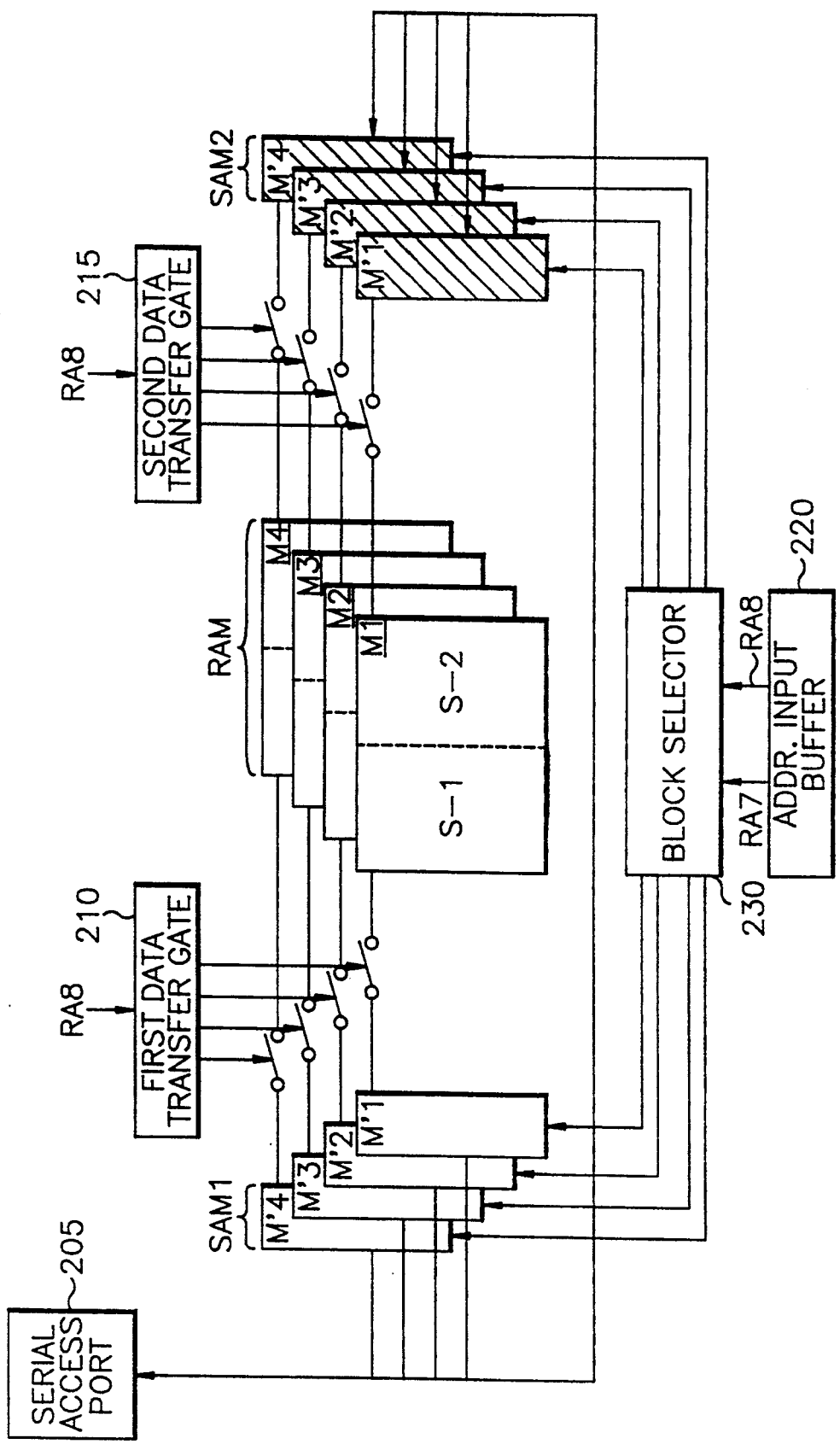
Figure 2B:
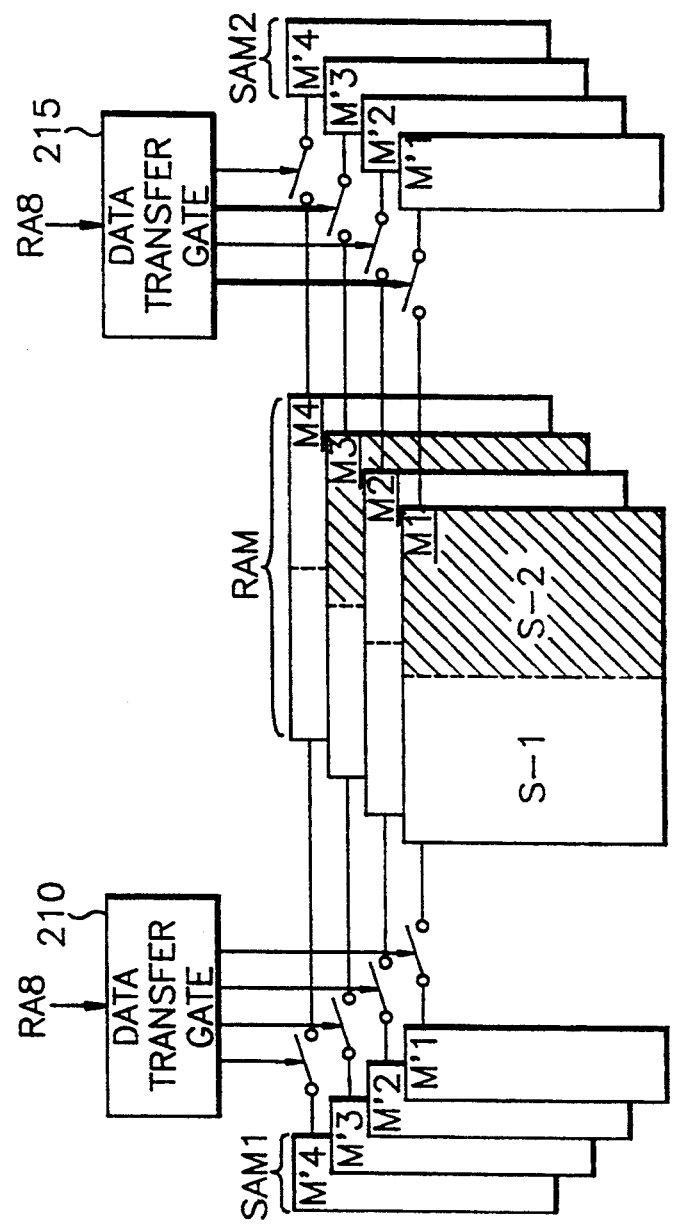

Illustrated in FIGS. 2A and 2B is a serial write transfer operation. FIG. 2A shows all of the blocks M'1, M'2, M'3, M'4 of serial access memory SAM2 enabled by the block selector 230 to receive data from the serial access port 205. Transfer and receipt of data is indicated by the shading of the blocks. During the transfer of the data from serial access memory SAM2 to the second sub-blocks S-2 of the random access memory RAM, the second data transfer gate 215 selectively enables transfer between the selected blocks of serial access memory SAM2 and the second sub-blocks S-2 of blocks M1 and M3 in random access memory RAM, in dependance upon the first address signals, RA8, applied to the second data transfer gate 215.

Figure 2C:
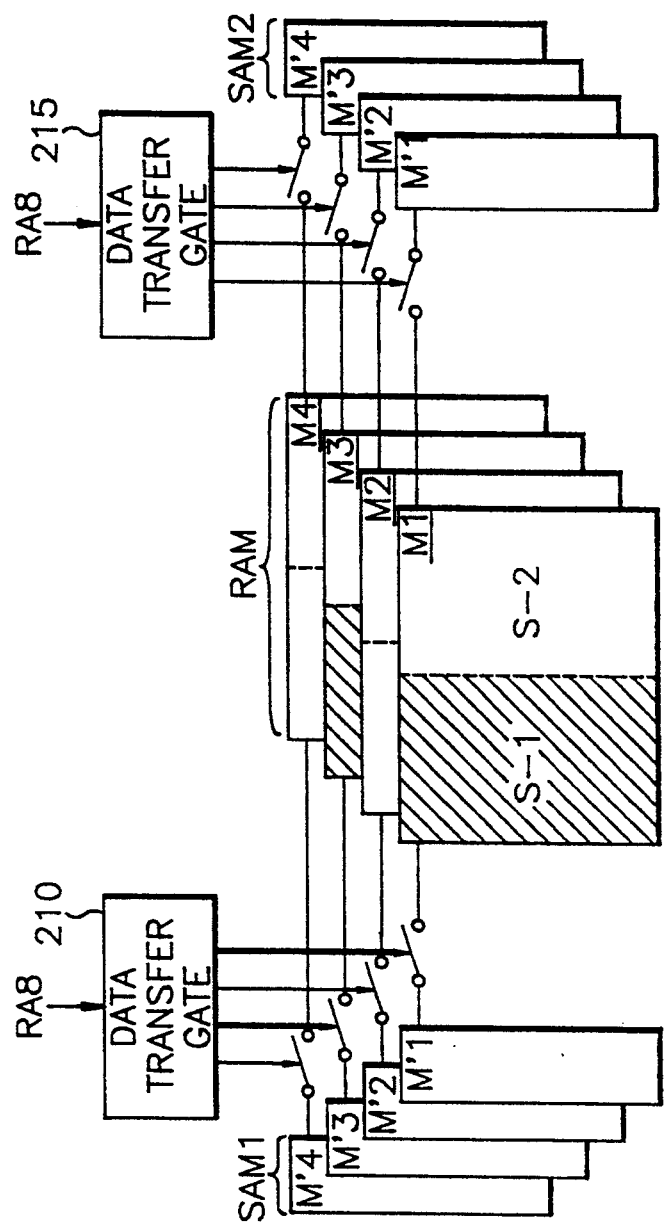
FIGS. 2C and 2D are block diagrams showing block selection and data transmission according to the present invention during a serial read transfer operation
Figure 2D:
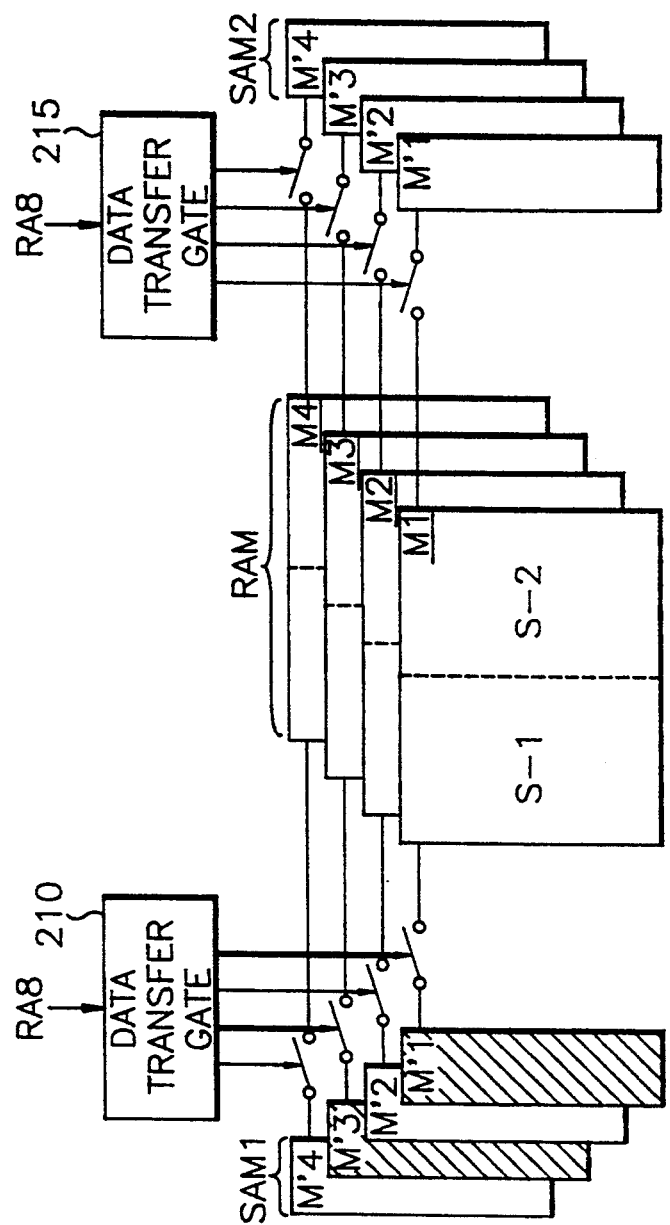

Illustrated in FIGS. 2C and 2D is 3 serial read transfer operation. Selected data in first sub-blocks S-1 of blocks M1 and M3, shown in FIG. 2C, is transferred to blocks M'1 and M'3 of serial access memory SAM1 under control of the first data transfer gate 210 as is shown in FIG. 2D. The data in blocks M'1 and M'3 of serial access memory SAM1 is then provided to serial access port 205.

Figure 3:
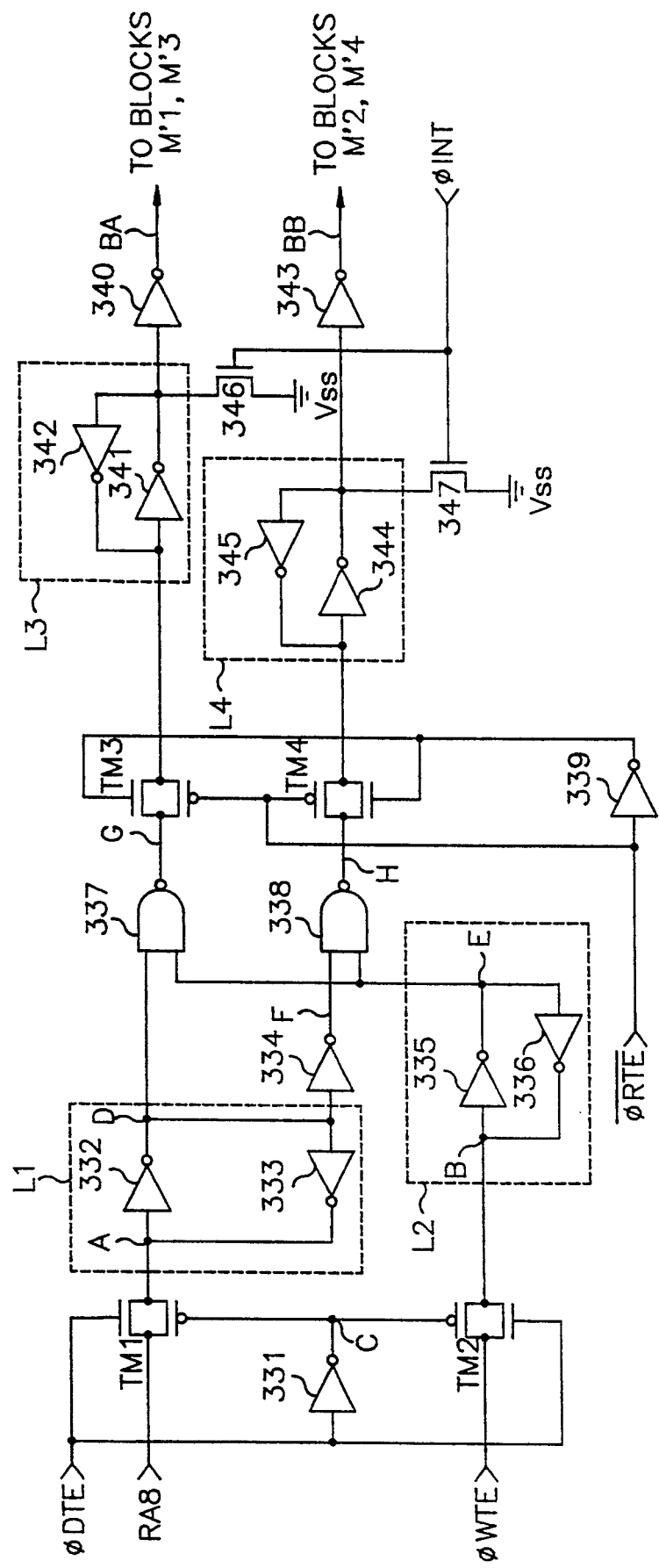
FIG. 3 is a block selector constructed according to the present invention.

FIG. 3 shows the circuit diagram for block selector 230 shown in FIG. 2A, constructed according to the principles of the present invention. First and second input gate elements TM1, TM2 receive and transmit the first address signals RA8 and a write transfer enable signal ΦWTE, respectively, according to a data transmission enable signal ΦDTE applied commonly to the first and second input gates TM1 and TM2 as a control signal. First and second latch circuits L1, L2, comprising CMOS inverters 332, 333, 335, 336 respectively, latch first and second intermediate signals A, B from the first and second input elements TM1, TM2, respectively. A first NAND gate 337 receives the first and second intermediate signals A, B from the first and second latch circuits L1, L2 to generate a third intermediate signal G. A second NAND gate 338 receives an inverted first intermediate signal from the; first latch circuit L1 and the second intermediate signal B of the second latch circuit L2 to generate a fourth intermediate signal H. First and second transmission gate elements TM3, TM4 transmit the third and fourth intermediate signals G, H from the first and second NAND gates 337, 338 in response to a read transfer enable signal ΦR T E. Third and fourth latch circuits L3, L4 respectively, comprising CMOS inverters 341, 342, and 344, 345 respectively, latch the output signals of the first and second transmission elements TM3, TM4.

Initial value setting transistors 346, 347, for initializing the third and fourth latch circuits L3, L4 to a logic "low" state, are connected to the output terminals of the third and fourth latch circuits L3, L4, respectively, and are controlled by an initial value setting signal ΦINT. The output block selection signals BA of latch circuit L3 is applied to blocks M'1, M'3 and the output block selection signals BB from latch circuit L4 is applied to blocks and M'2, M'4 (see FIG. 2A), via inverters 40 and 43, respectively.

Summarizing the operation of the block selector 230, during serial read operations, either blocks M'1, M'3 or blocks M'2, M'4 of serial access memory SAM1 are enabled to receive data from random access memory RAM by block selector 230. During serial write operations however, all blocks M'1, M'2, M'3, and M'4 of serial access memory SAM2 are enabled by the block selector to receive data from the serial access port.

Figure 4:
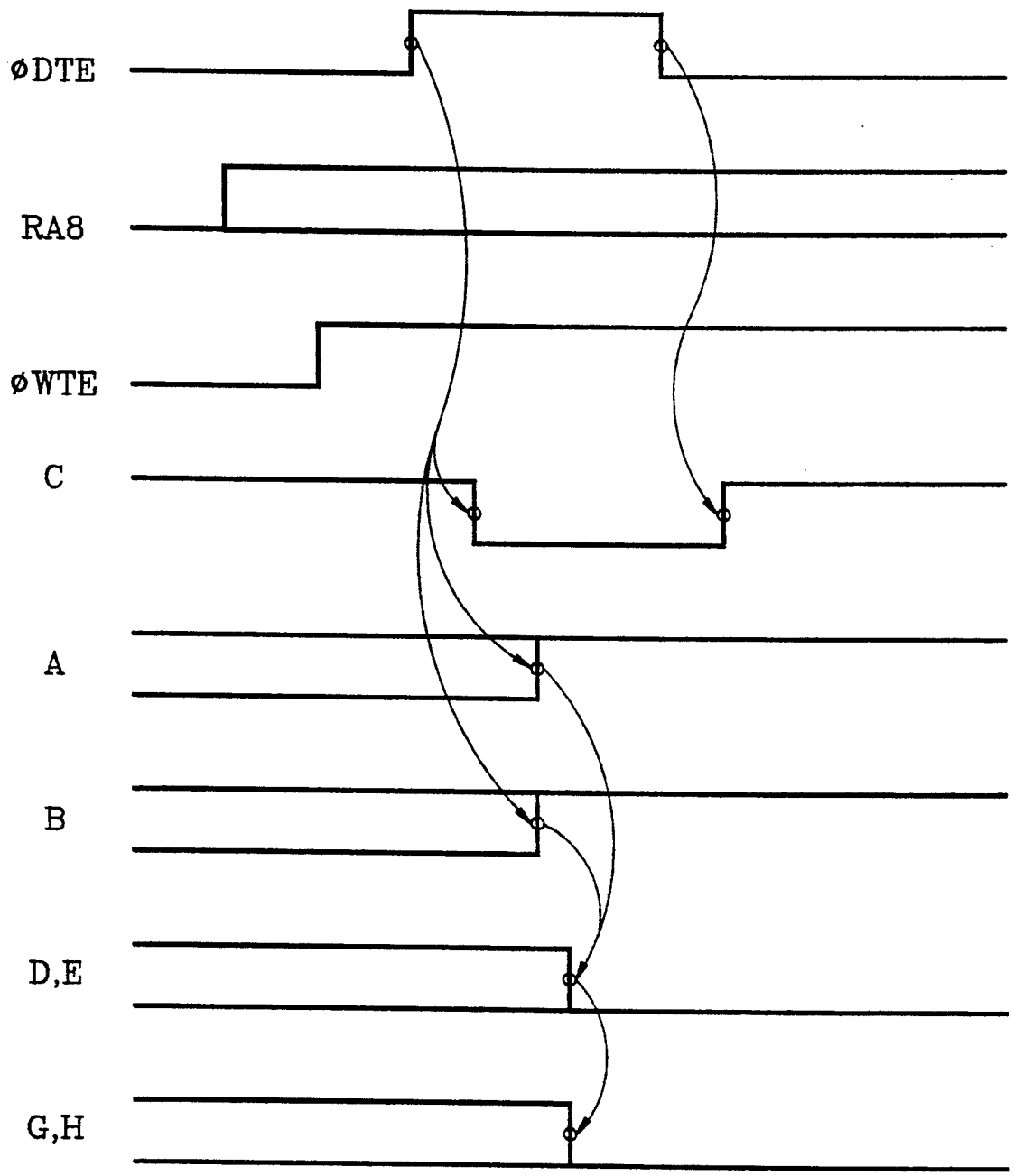
FIG. 4 is an operational tinting chart showing serial write transfer operation for the block selector of FIG. 2.

Turning now to FIG. 4, the timing of the signals received by the circuit of FIG. 3 during a serial write transfer operation will now be described. When a random access memory according to the present invention is in the serial write transfer operation mode, the first address signals, RA8, and the write transfer enable signal ΦWTE are placed in logic "high" states, as is indicated in FIG. 4, and both signals are applied to the first and second input elements TM1, TM2. These signals are transmitted to the first and second latch circuits L1, L2 as the first and second intermediate signals A, B, respectively, when the data transfer enable signal ΦDTE is also raised to a logic "high" state. Then, the first and second latch circuits L1, L2 latch the first and second intermediate signals A, B, respectively, and maintain the latched signals even if the first and second input elements TM1, TM2 are turned to an off state (i.e., a non-electrically conducting state) due to the ΦDTE returning to a logic "low" state. The third and fourth intermediate signals C, D of the first and second NAND gates 337, 338 will be at a logic "high" state and be transmitted to the third and fourth latch circuits L3, L4, respectively, applied to the first and second transmission elements TM3, TM4 and then applied to inverters 340, 343 when the read transfer enable signal ΦRTE is in a logic "low" state.

The initial value setting transistors 346, 347 are turned on by the initial value setting signal ΦINT in the logic "high" state, so that the block selection signals BA, BB are initialized to the logic "low" state. When the video random access memory according to the present invention is in the serial write transfer operation mode, however, the initial value setting signal ΦINT will change its logic state to the logic "low" state to turn off the initial value setting transistors 346, 347. When the initial value setting transistors are off, the block selection signal data, BA from the third transmission gate element TM3 is provided to blocks M'1 and M'3 of serial access memories SAM1 and SAM2 through inverter 340. The block selection signals BB from fourth transmission element TM4 are provided to blocks M'2 and M'4 of serial access memories SAM1, SAM2 through inverter 343.

The third and fourth latch circuits L3, L4 maintain the first and second intermediate signals received from the third and fourth transmission elements regardless of whether the logic state of the read transfer enable signal ΦRTE should thereafter change. Block selection signals BA, BB are enabled to the logic "high" state. At this time, the blocks M'1, M'3, and M'2, M'4, respectively receiving block selection signals BA, BB are all selected and the data to be written into the random access memory serially is transferred to all blocks of a serial access memory from the serial access port.

In a serial read transfer operation, only the blocks M'1, M'3 would be selected in response to a logically low first address signals RA8 since the write transfer enable signal ΦWTE is at a logic "low" state. Similarly, blocks M'2, M'4 would be selected in response to a logically high first address signal, RA8.

Figure 5:
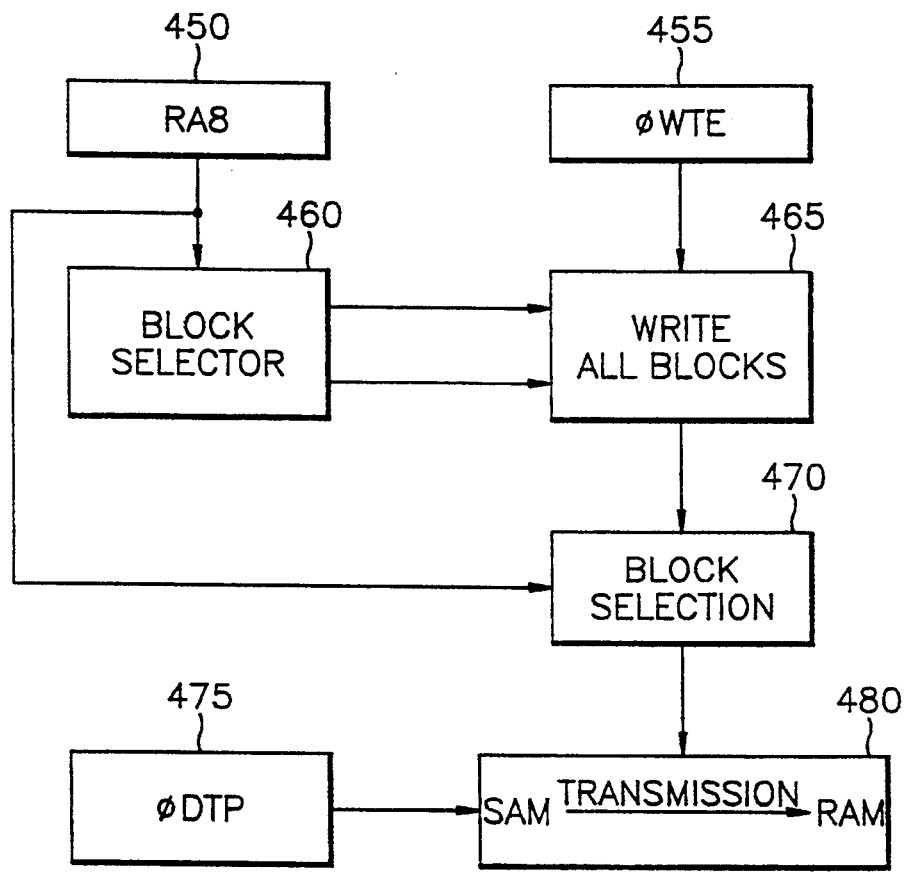
FIG. 5 is a flow chart illustrating a serial write transfer operation conducted according to the principles of the present invention.

FIG. 5 is a flow chart illustrating block selection in a serial write operation. The first address signals RA8 at step 450 are received by the block selector at step 460, and the write transfer enable signal ΦWTE generated in step 455, is applied in step 465 to enable data to be written to all blocks of the serial access memory. Block selection then occurs in step 470, causing the data in the serial access memory to be transmitted in step 480 to the random access memory selectively when the data transfer pulse ΦDTP is provided in step 475.

Figure 6:
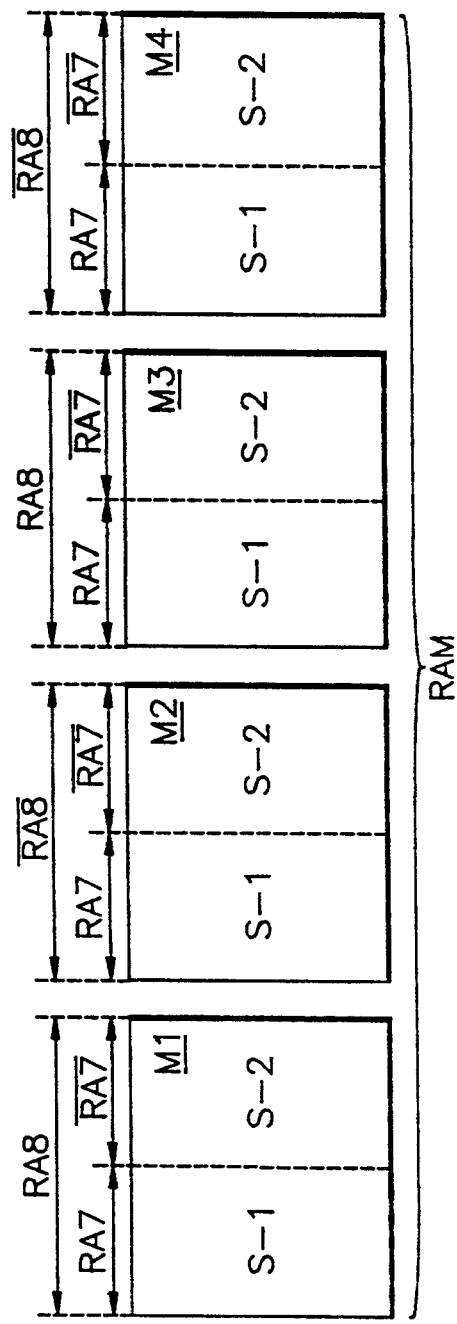
FIG. 6 is a representation of an addressing scheme for a blocks and sub-blocks of the random access memory.

A specific addressing scheme for controlling enablement of the serial access memory and the transmission gate is represented by FIGS. 6. This addressing scheme in conjunction with the serial write transfer operation reduces the time necessary for addresses to become available in the random access memory. The reduction in time may be essentially achieved by reallocating address decoding between the block selectors and the data transfer gates. Specifically, rather than only enable those blocks M'1–M'4 of the serial access memories which will be selected to transfer data from the serial access port to the random access memory, data is redundantly written to all of the blocks of one of the serial access memories. Therefore, less address decoding is required prior to the transfer of data to the serial access memory. After the data has been transferred to the serial access memory, the data is selectively transferred from only the selected blocks. The address decoding is essentially partially preformed by the application of the address RA8 to the data transfer gates which, in turn, control transfer of data between a serial access memory and the random access memory, as well as between the random access memory and a serial access memory.

Describing the delayed decoding addressing scheme in reference to FIG. 2A, data may be redundantly written to all of the blocks of the selected serial access memory in response to second address signals, RA7. In the example represented by FIGS. 2A and 2B, serial access memory SAM2 is selected by low second address signals RA7. Consequently, the data stored in block M'1 may be the same data as that stored in block M'2. Similarly, the data stored in block M'3 may be the same as is stored in block M'4.

Figure 7:
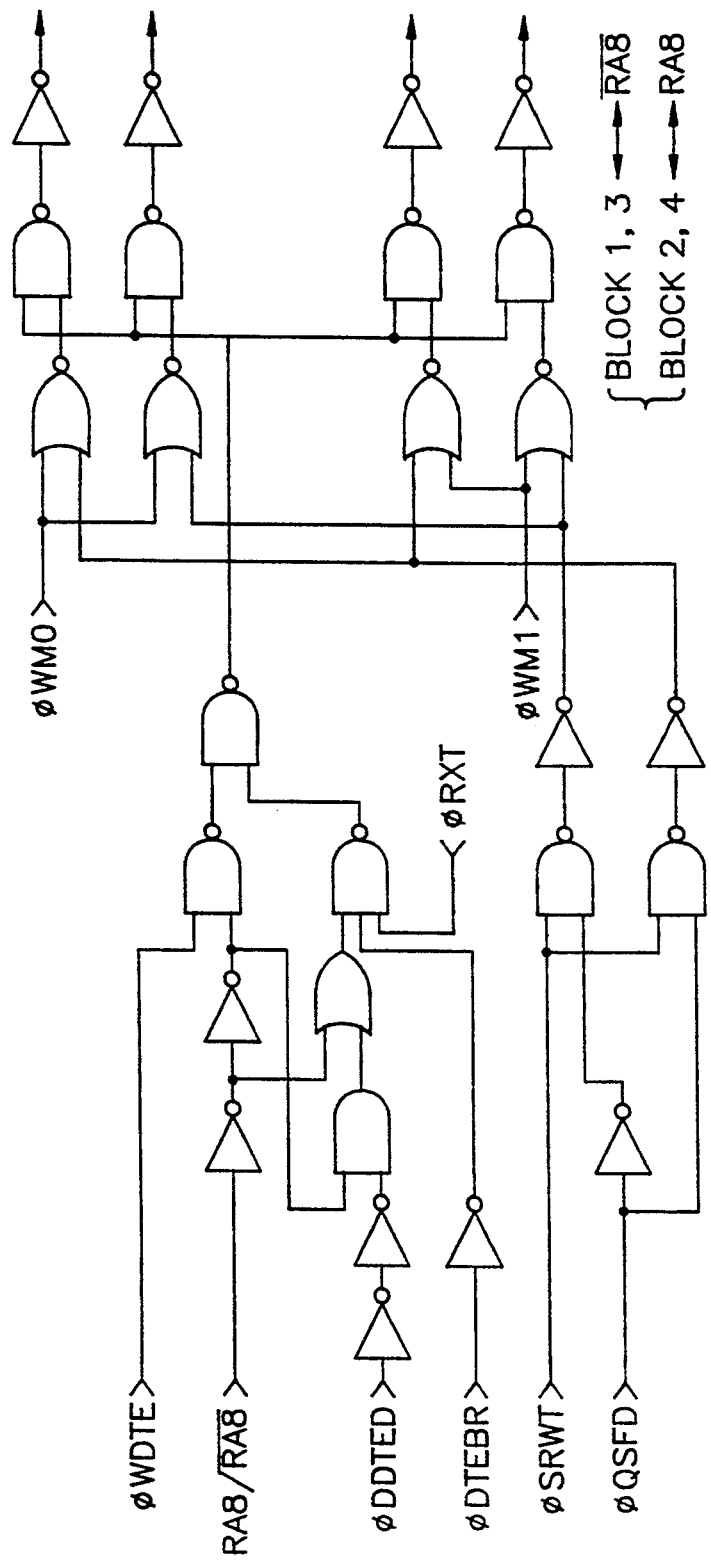
FIG. 7 is a decoding circuit for enabling data transfer gates.

In order to prevent redundant data from being written into the random access memory, however, the data transfer gate 210, 215 selectively transfers the data from only one of each group M'1, M'2 and M'3, M4 of blocks in the corresponding serial access memory to the selected corresponding second sub-blocks S-2 of the random access memory. Specifically, the data transfer gate is controlled by the first address signals RA8 as shown in FIG. 7 receiving RA8/RA8. As shown in FIG. 6, the first address signals RA8 differentiates between groups (e.g., pairs) of random access memory blocks M1, M3 and blocks M2, M4.

The delayed decoding addressing process disclosed in the foregoing paragraph avoids the necessity of completely decoding the first address signals RA8 signal before the data is written into the serial access memories from the serial access port. The decoding of the first address signal RA8 is completed by the data transfer gates, and consequently, the speed of the serial write transfer operation is increased since the completion of decoding of the first address signals RA8 can be performed simultaneously with or delayed until after transfer of data into the corresponding serial access memory.

FIG. 7 illustrates a circuit for enabling a data transfer gate appropriate for the video RAM of FIGS. 2A-2D. In response to high first address signals RA8, RAM block M1 and M3 are linked to SAM1 blocks M'1 and M'3, respectively. Similarly, in response to low first address signals R A 8, RAM block M2 and M4 are linked to SAM1 blocks M'2 and M'4, respectively.

It may be readily appreciated therefore, that, according to the present invention, a serial write transfer operation is performed easily and rapidly by writing the data on all blocks of the serial access memory simultaneously and transferred selectively to the random access memory blocks, such that high speed data processing is possible in a video RAM. As is evident from the circuit of FIG. 3, during a serial write transfer operation when ΦDTE and ΦWTE are both logic "high," all of the blocks of SAM1 and SAM2 are selected. In contrast, during a serial read transfer operation when ΦDTE is logic "high" and ΦWTE is logic "low," blocks either M'1, M'3 or M'2, M'4 are selected in dependence upon the logic state of the first address signals.

What is claimed is:

1. A video random access memory for performing serial read and write data transfer operations, said video random access memory comprising:
   a random access memory having a plurality of blocks each having a plurality of memory cells in a matrix;
   a serial access memory having a plurality of blocks each having a plurality of memory cells connected to each column of corresponding blocks of said random access memory; and
   block selection means for enabling transfer of serial write data from said serial access memory to selected blocks of said random access memory after writing said serial write data to all of said plurality of blocks of said serial access memory.

2. The video random access memory as claimed in claim 1, wherein block selection means comprises:
   input means for receiving and providing address signals and write transfer enable signals according to transmission enable signals;
   first latch means for latching said address signals and said write transfer enable signals provided by said input means;
   logic gate means for generating first intermediate signals and second intermediate signals by logically combining said block selection signals and said write transfer enable signals latched by said first latch means;
   transmission means for receiving and providing said first intermediate signals and said second intermediate signals in response to read transfer enable signals; and
   second latch means for latching said first intermediate signals and said second intermediate signals provided by said transmission means.

3. The video random access memory as claimed in claim 2, wherein said input means and said transmission means each comprise two transmission gates.

4. The video random access memory as claimed in claim 2, wherein said first latch means and said second latch means each comprise a pair of CMOS inverters.

5. The video random access memory as claimed in claim 2, wherein said block selection means further comprises initial value setting means, controlled by initialization signals, for initializing a logic state of said second latch means.

6. A method for writing data to video random access memory comprising a random access memory portion comprising a plurality of blocks each having a plurality of memory cells in a matrix, a serial access memory portion comprising a plurality of blocks each having a plurality of memory cells connected to each column of corresponding blocks of said random access memory portion, a serial access port for providing serial write data to and receiving serial read data from said serial access memory portion, block selector means for enabling storage of said serial write data into said serial access memory portion, and data transfer gate means for enabling transfer of said serial write data from said serial access memory portion to said random access memory portion, said method comprising:
   writing said serial write data to all of said plurality of blocks of said serial access port under control of said block selector means and then selectively transferring said serial write data to selected blocks of said random access memory portion under control of said data transfer gate means.

7. A memory device for performing serial read and serial write data transfer operations, said memory device comprising:
   a random access memory comprising a plurality of blocks, each of said blocks of said random access memory having a plurality of memory cells in a matrix;
   a serial access memory comprising a plurality of blocks, each of said blocks of said serial access memory having a plurality of memory cells connected to each column of a different one of said blocks of said random access memory;
   block selection means for enabling said serial access memory to receive serial read data from said random access memory during serial read operations in response to address signals, and for enabling at least two of said blocks of said random access memory to receive serial write data from said serial access memory after said serial write data is written on all of said plurality of blocks of said serial access memory via a serial port during serial write operations; and
   data transfer means for transferring data between said random access memory and said serial access memory in response to said address signals.

8. A memory device as claimed in claim 7, wherein during said serial read operations said data transfer means enables transfer of said serial read data from blocks of said random access memory selected in response to said address signals.

9. A memory device as claimed in claim 7, wherein during said serial write operations said block selection means enables all blocks of said serial access memory to receive said serial write data independent of a logic state of said address signals and then said data transfer means transfers said serial write data from said serial access memory to blocks of said random access memory selected in response to said address signals.

10. A memory device as claimed in claim 9, wherein said serial write data is redundantly written to said blocks of said serial access memory so that the same serial write data is stored in at least two blocks of said serial access memory.

11. A memory device as claimed in claim 7, wherein said plurality of blocks of said serial access memory comprises a first serial block, a second serial block, a third serial block, and a fourth serial block, and said plurality of blocks of said random access memory comprises a first random block exchanging data with said first serial block, a second random block exchanging data with said second serial block, a third random block exchanging data with said third serial block, and a fourth random block exchanging data with said fourth serial block.

12. A memory device as claimed in claim 11, wherein during said serial write operations said block selecting means simultaneously enables said first serial block, said second serial block, said third serial block, and said fourth serial block to receive said serial write data from said serial port.

13. A memory device as claimed in claim 12, wherein after said serial write data is stored in said first serial block, said second serial block, said third serial block, and said fourth serial block, said data transfer means enables transmission of said serial write data to either said first random block and said third random block or said second random block and said fourth random block in dependence upon said address signals.

14. A memory device as claimed in claim 12, wherein exactly the same data is stored in said first serial block and said second serial block during said serial write operations.

15. A memory device as claimed in claim 13, wherein during said serial read operations said data transfer means enables transmission of said serial read data stored in either said first random block and said third random block or said second random block and said fourth random block to said first serial block and said third serial block or said second serial block and said fourth serial block in dependence upon said address signals.

16. A method for writing data to and reading data from a memory device, said memory device comprising: a random access memory comprising a first random block, a second random block, a third random block, and a fourth random block, each of said random blocks having a plurality of memory cells in a matrix; a serial access memory including a first serial block exchanging data with said first random block, a second serial block exchanging data with said second random block, a third serial block exchanging data with said third random block, and a fourth serial block exchanging data with a fourth random block, each of said serial blocks having a plurality of memory cells connected to each column of the corresponding random block; block selection means for enabling said serial access memory to receive serial read data from said random access memory during serial read operations in response to address signals and for enabling said serial access memory to receive serial write data from a serial port during serial write operations; and data transfer means for enabling transfer of data between said random access memory and said serial access memory in response to said address signals; said method comprising:

simultaneously enabling said first serial block, said second serial block, said third serial block, and said fourth serial block to receive said serial write data during said serial write operations; and selectively transferring said serial write data to either said first random block and said third random block or said second random block and said fourth random block in dependence upon said address signals.

17. A method as claimed in claim 16, further comprising transferring said serial read data stored in either said first random block and said third random block or said second random block and said fourth random block to said first serial block and said third serial block or said second serial block and said fourth serial block in response to said address signals during said serial read operations.

18. The video random access memory as claimed in claim 1, wherein block selection means comprises:

a first transmission gate for enabling transmission of an address signal in dependence upon a transmission enable signal;

a second transmission gate for enabling transmission of a write transfer enable signal in dependence upon said transmission enable signal;

first latch means comprising a pair of CMOS inverters, for providing a first latched signal by latching said address signal;

second latch means comprising a pair of CMOS inverters, for providing a second latched signal by latching said write enable signal:

a first inverter for inverting said first latched signal to provide an inverted latched signal;

a first NAND gate coupled to receive said first and second latched signals, for providing a first logic signal;

a second NAND gate coupled to receive said inverted latched signal and said second latched signal, for providing a second logic signal;

a third transmission gate for enabling transmission of said first logic signal in dependence upon a read enable signal;

a fourth transmission gate for enabling transmission of said second logic signal in dependence upon said read enable signal;

third latch means comprising a pair of CMOS inverters and an initial value setting transistor, for providing a third latched signal by latching said second logic signal transmitted from said third transmission gate in dependence upon an initial value setting signal;

fourth latch means comprising a pair of CMOS inverters and an initial value setting transistor, for providing a fourth latched signal by latching said third logic signal transmitted from said fourth transmission gate in dependence upon said initial value setting signal, said third and fourth latched signals enabling transfer of said serial write data from said serial access memory to selected blocks of said random access port after writing said serial write data to all of said plurality of blocks of said serial access memory.

19. The memory device as claimed in claim 7, wherein block selection means comprises:

a first transmission gate for enabling transmission of an address signal in dependence upon a transmission enable signal;

a second transmission gate for enabling transmission of a write transfer enable signal in dependence upon said transmission enable signal;

first latch means comprising a pair of CMOS inverters, for providing a first latched signal by latching said address signal;

second latch means comprising a pair of CMOS inverters, for providing a second latched signal by latching said write enable signal;

a first inverter for inverting said first latched signal to provide an inverted latched signal;

a first NAND gate coupled to receive said first and second latched signals, for providing a first logic signal;

a second NAND gate coupled to receive said inverted latched signal and said second latched signal, for providing a second logic signal;

a third transmission gate for enabling transmission of said first logic signal in dependence upon a read enable signal;

a fourth transmission gate for enabling transmission of said second logic signal in dependence upon said read enable signal;

third latch means comprising a pair of CMOS inverters and an initial value setting transistor, for providing a third latched signal by latching said second logic signal transmitted from said third transmission gate in dependence upon an initial value setting signal;

fourth latch means comprising a pair of CMOS inverters and an initial value setting transistor, for providing a fourth latched signal by latching said third logic signal transmitted from said fourth transmission gate in dependence upon said initial value setting signal, said third and fourth latched signals controlling said serial read operations and said serial write operations.

20. The video random access memory of claim 1, wherein block selection means comprises:

first transmission gate means for enabling transmission of an address signal in dependence upon a transmission enable signal, and for enabling transmission of a write transfer enable signal in dependence upon said transmission enable signal:

first latching means for providing a first latched signal by latching said address signal, and for providing a second latched signal by latching said write enable signal;

a first inverter for inverting said first latched signal to provide an inverted latched signal;

logic gate means for providing a first logic signal in dependence upon said first and second latched signals, and for providing a second logic signal in dependence upon said inverted latched signal and said second latched signal;

second transmission gate means for enabling transmission of said first logic signal in dependence upon a read enable signal, and for enabling transmission of said second logic signal in dependence upon said read enable signal;

second latching means for providing a third latched signal by latching said second logic signal transmitted from said third transmission gate in dependence upon an initial value setting signal, and for providing a fourth latched signal by latching said third logic signal transmitted from said fourth transmission gate in dependence upon said initial value setting signal, said third and fourth latched signals enabling transfer of said serial write data from said serial access memory to selected blocks of said random access port after writing said serial write data to all of said plurality of blocks of said serial access memory.

21. A random access memory for performing serial read and write data transfer operations, said random access memory comprising:

a first memory having a plurality of blocks each having a plurality of memory cells in a matrix;

a second memory having a plurality of blocks each having a plurality of memory cells connected to each column of corresponding blocks of said first memory; and block selection means for enabling transfer of data from said second memory to selected blocks of said first memory after writing said data to all of said plurality of blocks of said second memory, said block selection means comprising:

input means for receiving and providing address signals and write transfer enable signals;

first latch means for latching said address signals and said write transfer enable signals provided by said input means;

logic gate means for generating first intermediate signals and second intermediate signals by logically combining block selection signals and said write transfer enable signals latched by said first latch means;

transmission mean for receiving and providing said first intermediate signals and said second intermediate signals in response to read transfer enable signals; and second latch means for latching ones of said first intermediate signals and said second intermediate signals provided by said transmission means for enabling said data from said second memory to be transferred to selected blocks of said first memory.

22. The random access memory of claim 21, wherein said input means and said transmission means each comprise two transmission gates.

23. The random access memory of claim 21, wherein said first latch means and said second latch means each comprise a pair of CMOS inverters.

* * * * *

UNITED STATES PATENT AND TRADEMARK OFFICE
CERTIFICATE OF CORRECTION

PATENT NO. :
DATED      : 5,381,376
INVENTOR(S) : Jan. 10, 1995
             Min-Tae Kim, et al.

It is certified that error appears in the above-indentified patent and that said Letters Patent is hereby corrected as shown below:

On the title page:

item [57],     Line 6,      after "blocks", insert --,--;

Line 7,      between "transmitting" and "the", delete ",":

Column 1,      Line 26,     before "memory", change "arc" to --are--;

Column 2,      Line 66,     after "selection", change "And" to --and--;

Column 3,      Line 5,      after "operational" change "tinting" to --timing--;

UNITED STATES PATENT AND TRADEMARK OFFICE
CERTIFICATE OF CORRECTION

PATENT NO. :
DATED      : 5,381,376
INVENTOR(S): Jan. 10, 1995
             Min-Tae Kim, et al.

It is certified that error appears in the above-indentified patent and that said Letters Patent is hereby corrected as shown below:

Column 4,   Line 8,    after "signals", delete ",";

Line 12,   after "of", change "serial;" to --the--.

Line 30,   before "serial", change "3" to --a--;

Line 54,   after "the", delete ";";

Line 61,   before "Third", change "$\phi$R T E" to --$\phi\overline{\text{R T E}}$--;

Column 6,   Line 3,    after "signals", change "R A 8" to --$\overline{\text{R A 8}}$--;

Line 46,   before "Consequently", change "R A 7" to --$\overline{\text{R A 7}}$--;

UNITED STATES PATENT AND TRADEMARK OFFICE
CERTIFICATE OF CORRECTION

PATENT NO. : 5,381,376
DATED : Jan. 10, 1995
INVENTOR(S) : Min-Tae Kim, et al.

It is certified that error appears in the above-indentified patent and that said Letters Patent is hereby corrected as shown below:

Column 6, Line 58, after "receiving", change "RA8/R A 8"

to --RA8/$\overline{\text{R A 8}}$--; and

Column 7, Line 10, after "signals", change "R A 8" to --$\overline{\text{R A 8}}$--:

Signed and Sealed this

First Day of July, 1997

*Attest:*

BRUCE LEHMAN

*Attesting Officer*     Commissioner of Patents and Trademarks